(12) United States Patent
Beckhart et al.

(10) Patent No.: US 7,121,414 B2
(45) Date of Patent: Oct. 17, 2006

(54) SEMICONDUCTOR CASSETTE REDUCER

(75) Inventors: Gordon Haggott Beckhart, Colorado Springs, CO (US); Patrick Rooney Conarro, Green Mountain Falls, CO (US); Kamran Michael Farivar-Sadri, Colorado Springs, CO (US)

(73) Assignee: Brooks Automation, Inc., Chelmsford, MA (US)

( * ) Notice: Subject to any disclaimer, the term of this patent is extended or adjusted under 35 U.S.C. 154(b) by 0 days.

(21) Appl. No.: 10/035,644

(22) Filed: Dec. 28, 2001

(65) Prior Publication Data

US 2003/0121870 A1 Jul. 3, 2003

(51) Int. Cl.
*A47G 19/08* (2006.01)

(52) U.S. Cl. .................... 211/41.18; 206/711
(58) Field of Classification Search .......... 211/41.18, 211/41.12, 41.1, 40; 414/438, 800, 416.08; 118/728, 500; 256/454, 711; 134/902; 432/254, 258, 253; 206/211, 454, 832, 833, 206/710, 711
See application file for complete search history.

(56) References Cited

U.S. PATENT DOCUMENTS

| | | | | |
|---|---|---|---|---|
| 2,208,734 A | * | 7/1940 | Schreiber | 432/259 |
| 4,153,164 A | * | 5/1979 | Hofmeister et al. | 118/500 |
| 4,228,902 A | * | 10/1980 | Schulte | 118/500 |
| 4,930,634 A | * | 6/1990 | Williams et al. | 206/454 |
| 5,387,067 A | * | 2/1995 | Grunes | 118/500 |
| 5,390,785 A | * | 2/1995 | Garric et al. | 206/213.1 |
| 5,421,056 A | * | 6/1995 | Tateyama et al. | 134/153 |
| 5,445,271 A | * | 8/1995 | Kakizaki et al. | 206/459.5 |
| 5,452,795 A | * | 9/1995 | Gallagher et al. | 206/711 |
| 5,472,099 A | * | 12/1995 | Terashima | 211/41.18 |
| 5,482,161 A | * | 1/1996 | Williams et al. | 206/711 |
| 5,570,987 A | * | 11/1996 | McKenna | 414/416.01 |
| 5,711,427 A | * | 1/1998 | Nyseth | 206/710 |
| 5,733,426 A | * | 3/1998 | Cox et al. | 204/298.01 |
| 5,788,082 A | * | 8/1998 | Nyseth | 206/454 |
| 5,915,562 A | * | 6/1999 | Nyseth et al. | 206/710 |
| 5,934,984 A | * | 8/1999 | Togawa et al. | 414/936 |
| 5,950,843 A | * | 9/1999 | Ohori | 211/41.18 |
| 5,957,292 A | * | 9/1999 | Mikkelsen et al. | 206/710 |
| 6,010,008 A | * | 1/2000 | Nyseth et al. | 206/454 |
| 6,039,186 A | * | 3/2000 | Bhatt et al. | 206/711 |
| 6,092,981 A | * | 7/2000 | Pfeiffer et al. | 206/710 |
| 6,095,335 A | | 8/2000 | Busby | 206/711 |
| 6,105,782 A | * | 8/2000 | Fujimori et al. | 206/1.5 |
| 6,110,285 A | * | 8/2000 | Kitazawa et al. | 118/715 |
| 6,126,382 A | * | 10/2000 | Scales et al. | 198/394 |
| 6,145,673 A | * | 11/2000 | Burrows et al. | 211/41.12 |
| D436,490 S | * | 1/2001 | Kwok | D6/630 |
| 6,176,023 B1 | * | 1/2001 | Doche | 34/451 |
| 6,186,331 B1 | * | 2/2001 | Kinpara et al. | 206/711 |
| 6,270,307 B1 | * | 8/2001 | Sinha | 198/394 |
| 6,341,935 B1 | * | 1/2002 | Tseng | 118/500 |
| 6,382,419 B1 | * | 5/2002 | Fujimori et al. | 206/454 |
| 6,398,032 B1 | * | 6/2002 | Fosnight et al. | 206/711 |
| 6,398,475 B1 | * | 6/2002 | Ishikawa | 414/217 |

(Continued)

*Primary Examiner*—Jennifer E. Novosad
(74) *Attorney, Agent, or Firm*—Perman & Green, LLP; Richard Pickreign

(57) ABSTRACT

A semiconductor cassette reducer has a first substantially U-shaped plate and a second substantially U-shaped plate. A number of wafer supports connect the first substantially U-shaped plate to the second substantially U-shaped plate. Several retention springs are attached to the first substantially U-shaped plate. The retention springs hold the semiconductor cassette reducer in a FOUP (front opening unified pod).

18 Claims, 3 Drawing Sheets

U.S. PATENT DOCUMENTS 6,536,592 B1 * 3/2003 Chang et al. ............ 206/459.1

6,622,883 B1 * 9/2003 Wu et al. .................. 220/323

* cited by examiner

SEMICONDUCTOR CASSETTE REDUCER

FIELD OF THE INVENTION

The present invention relates generally to the field of semiconductor processing tools and more particularly to a semiconductor cassette reducer.

BACKGROUND OF THE INVENTION

Semiconductor wafers are produced in a number of different sizes. Older facilities typically have smaller size wafers. The size of wafers has increased over time as technology has advanced. As the size of the wafer increases the cost of processing each wafer increases. In order to justify larger wafer sizes the defect rate for each wafer must be low enough to provide a satisfactory yield. As a result, semiconductor processing facilities may want to prove out a design using smaller size wafers. This reduces the cost of mistakes. Unfortunately, the latest and best processing equipment is generally designed to processes the largest wafers. The wafers are held in containers called front opening unified pods (FOUPs). A FOUP 10 is shown in FIG. 1. Thus there exists a need for a device that allows facilities to use the latest processing equipment without being required to process the largest wafers.

DETAILED DESCRIPTION OF THE DRAWINGS

A semiconductor cassette reducer has a first substantially U-shaped plate and a second substantially U-shaped plate. A number of wafer supports connect the first substantially U-shaped plate to the second substantially U-shaped plate. Several retention springs are attached to the first substantially U-shaped plate. The retention springs hold the semiconductor cassette reducer in a FOUP (front opening unified pod).

Figure 1:
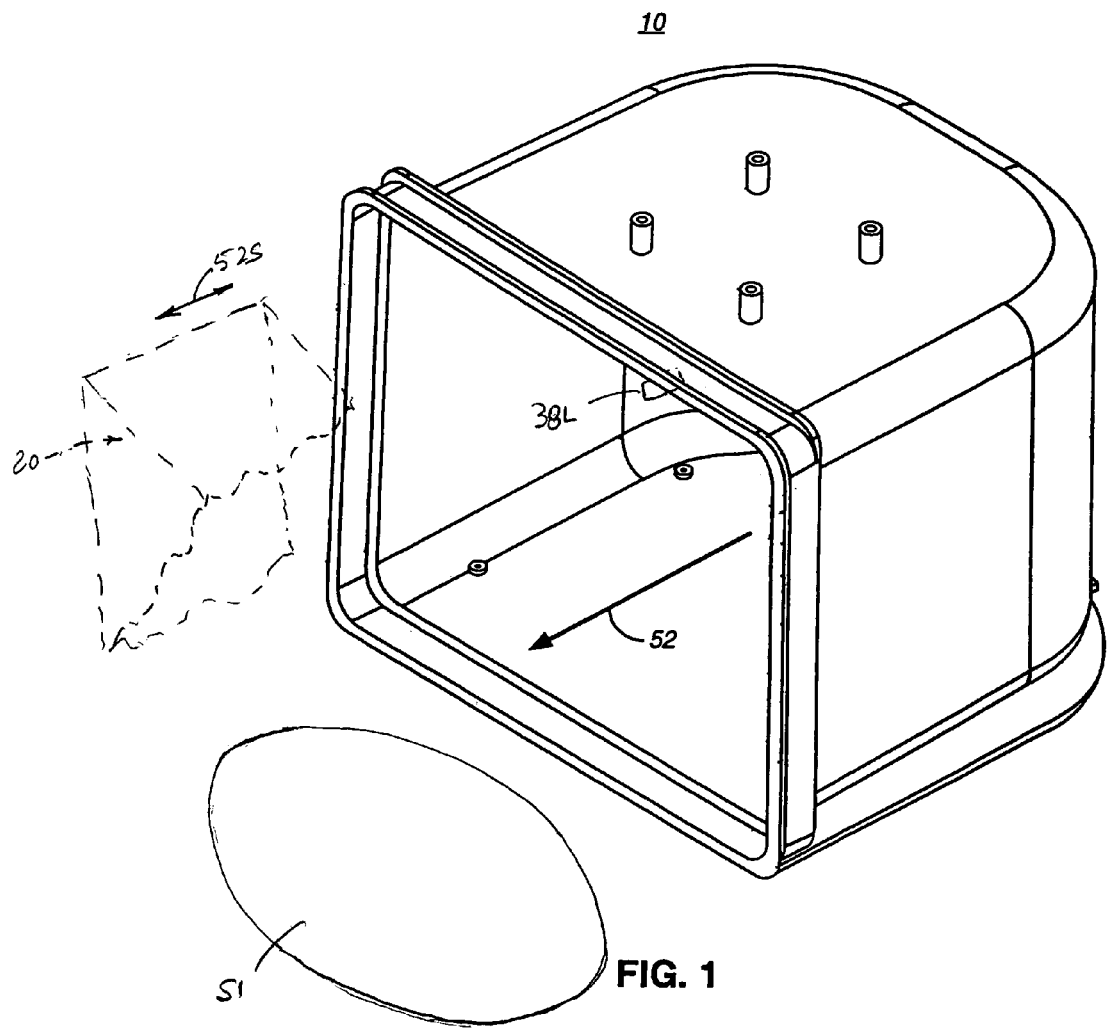
FIG. 1 is a perspective view of a front opening unified pod.
Figure 2:
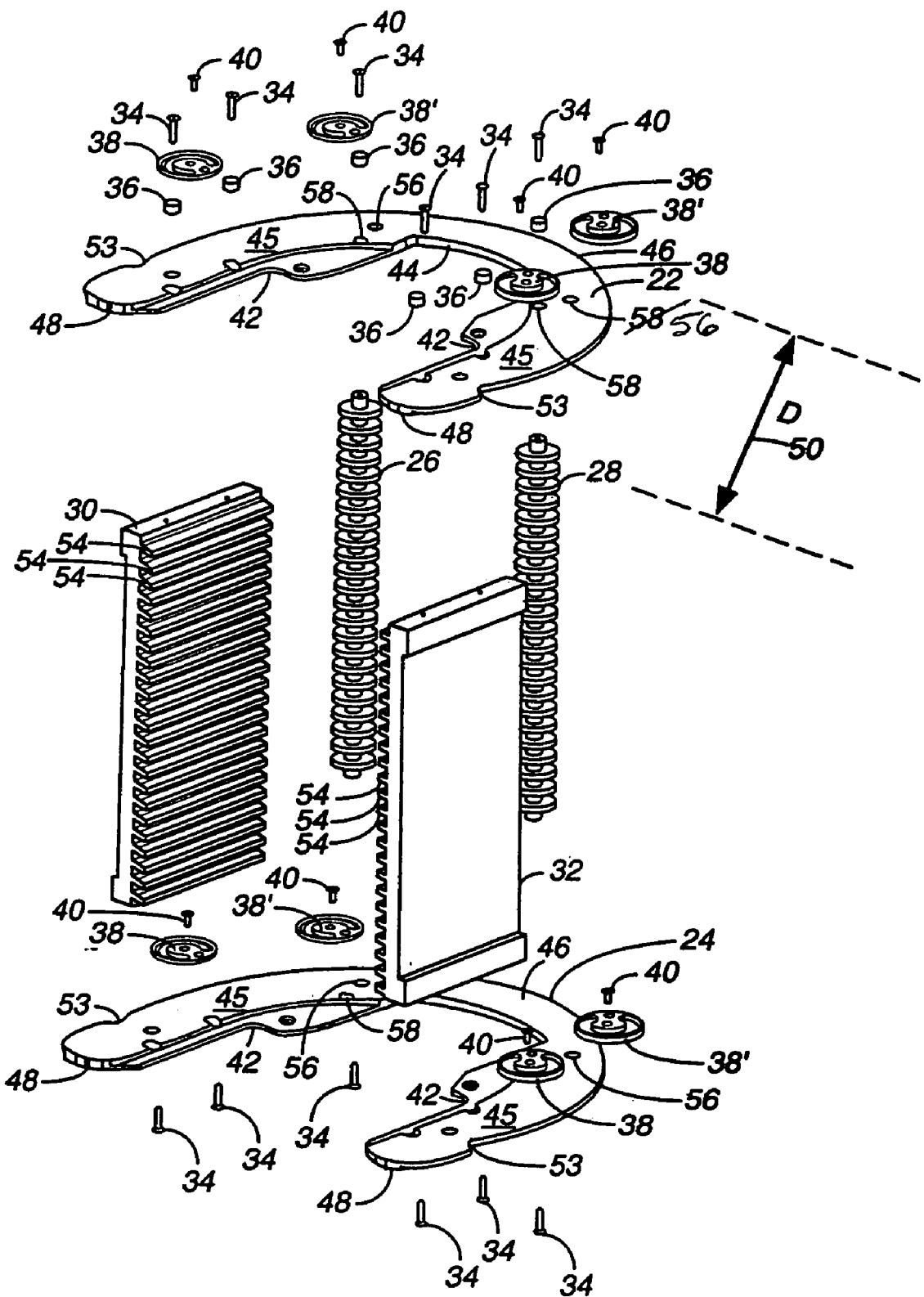
FIG. 2 is an exploded view of a semiconductor cassette reducer in accordance with one embodiment of the invention.
Figure 3:
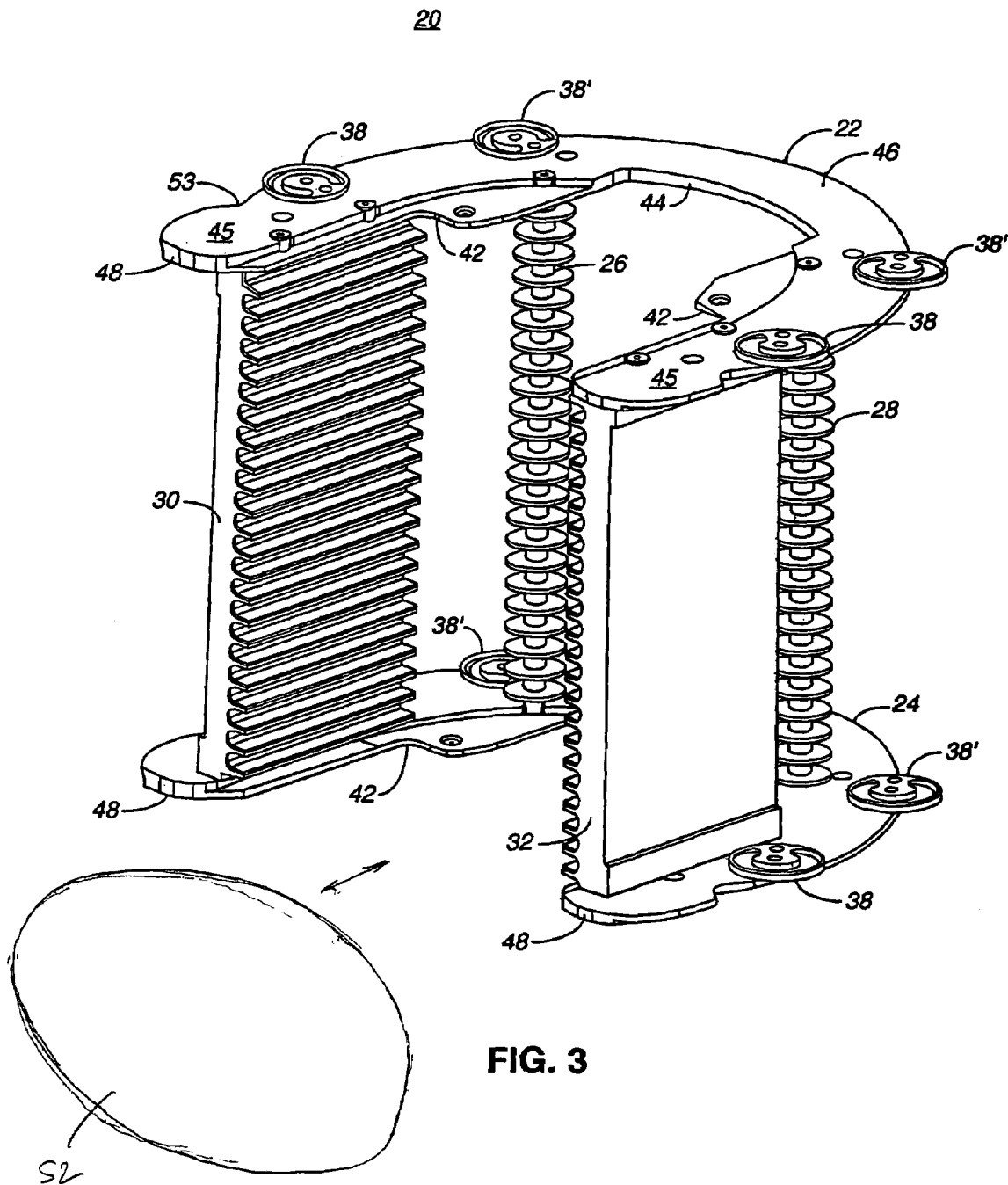
FIG. 3 is a top left view perspective of a semiconductor cassette reducer in accordance with one embodiment of the invention.

FIG. 2 is an exploded view of a semiconductor cassette reducer 20 in accordance with one embodiment of the invention. The semiconductor cassette reducer 20 has a first substantially U-shaped plate 22 and a second substantially U-shaped plate 24. A plurality of wafer supports 26, 28, 30, 32 connect the first substantially U-shaped plate, 22 to the second substantially U-shaped plate 24 as shown in FIG. 3. In one embodiment screws 34 and washers 36 are used to attach the U-shaped plates 22, 24 to the wafer supports 26, 28, 30, 32. Retention springs (plurality of retention springs, more than two retention springs, flexible disks) 38 are attached to the first U-shaped plate 22 and the second U-shaped plate 24. In one embodiment, the retention springs 38 are attached using screws 40. In one embodiment, the retention springs are formed of a rubbery substance that is deformable. When the cassette reducer 20 is placed (in the direction indicated by arrow 52S in FIG. 1) in the FOUP the retention springs 38 (which as shown in FIG. 3 project beyond lateral peripheral edges of plates 22, 24) grab the sides of the FOUP. The back two retention springs 38' lock into a depression (lip) 38L in the FOUP. This provides a solid grip for the cassette in FOUP. The retention springs also make it very easy to insert and remove the cassette from the FOUP.

In one embodiment, the U-shaped plates 22, 24 have a pair of interior arm cutouts (first arm cutout) 42. The cutouts 42 allow the end effector of a robot arm easy access to the wafers in the cassette reducer 20. The U-shaped plates 22, 24 also have a base cutout 44. The base cutout also makes it easier for the end effector to access wafers. The U-shaped plates have a pair of arms 45. In one embodiment, a base 46 to tip 48 distance 50 is less than an interior depth 52 (see FIG. 1) of a front opening unified pod. In one embodiment, the U-shaped plates 22, 24 have an exterior partial S-shaped cutout 53. These S-shaped cutouts are necessary for the U-shaped plates to fit inside certain FOUP designs.

The plurality of wafer supports 26, 28, 30, 32 include a pair of side panels (wafer support panel) 30, 32. The side panels have a plurality of lips 54. The lips hold the semiconductor wafers. The plurality of wafer supports 26, 28, 30, 32 also includes a pair of columns (column wafer supports) 26, 28. The columns 26, 28 have a first position 56 and a second position 58. The first position allows the wafers to be coaxially aligned with the position of the larger wafers in the FOUP and the second position aligns the front edge of the wafer with the front edge of the FOUP.

FIG. 3 is a top left view perspective of a semiconductor cassette reducer 20 in accordance with, one embodiment of the invention. The cassette reducer 20 fits inside of the FOUP of FIG. 1. In one embodiment, the FOUP is designed to hold 300 mm diameter semiconductor wafers S1 (see FIG. 1) and the cassette reducer 20 holds 200 mm diameter semiconductor wafers S2 (see FIG. 3). FIG. 3 shows the semiconductor cassette reducer 20 assembled. The same reference numerals are used for both figures.

Thus there has been described a semiconductor cassette reducer that is easy to install and allows semiconductor facilities to use the latest processing equipment without being required to process the largest wafers.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. A semiconductor substrate holding apparatus comprising a substrate holder capable of holding a substrate of a predetermined size, and a cassette reducer adapted for being mounted in the substrate holder, the cassette reducer comprising:
   a first substantially U-shaped plate;
   a second substantially U-shaped plate;
   a plurality of wafer supports joining the first substantially U-shaped plate to the second substantially U-shaped plate; and
   more than two retention springs attached to the first substantially U-shaped plate for mounting the cassette reducer to the substrate holder, wherein when mounted to the holder, the cassette reducer effects a reduction in the substrate holder enabling the holder to hold another substrate smaller than the predetermined size.

2. The apparatus of claim 1, wherein the first substantially U-shaped plate has a pair of interior arm cutouts.

3. The apparatus of claim 1, wherein the first substantially U-shaped plate has a base cutout.

4. The apparatus of claim 1, wherein the holder is a front opening unified pod, and a base to tip distance of the first substantially U-shaped plate is less than an interior depth of the front opening unified pod to which the semiconductor cassette reducer is adapted to be mated.

5. The apparatus of claim 1, wherein the plurality of wafer supports includes a pair of side panels connected to a pair of arms of the first substantially U-shaped plate.

6. The apparatus of claim 5, wherein the pair of side panels have a plurality of lips.

7. The apparatus of claim 1, wherein the first substantially U-shaped plate has an exterior partial S-shaped cutout.

8. The apparatus of claim 1, wherein the plurality of wafer supports includes a pair of columns.

9. The apparatus of claim 8, wherein the pair of columns have at least two positions.

10. A semiconductor cassette reducer, comprising:
a first substantially U-shaped plate having a first pair of arms each having a first arm cutout;
a second substantially U-shaped plate having a second pair of arms each having a second arm cutout;
a plurality of wafer supports connecting the first substantially U-shaped plate to the second substantially U-shaped plate; and
at least one resiliently flexible retention member mounted on at least one of the first substantially U-shaped plate or the second substantially U-shaped plate, and projecting outward beyond a lateral peripheral edge of the at least one of the first substantially U-shaped plate or the second substantially U-shaped plate.

11. The semiconductor cassette reducer of claim 10, wherein the at least one resiliently flexible retention member comprises a plurality of retention springs attached to the first substantially U-shaped plate.

12. The semiconductor cassette reducer of claim 11, wherein one of the plurality of retention springs is designed to mate with a lip of a front opening unified pod to which the semiconductor cassette reducer is adapted to be mated.

13. The semiconductor cassette reducer of claim 10, wherein the plurality of wafer supports include a wafer support panel attached to one of the first pair of arms.

14. A semiconductor cassette reducer for a substrate holder, the cassette reducer comprising:
a first substantially U-shaped plate;
a second substantially U-shaped plate;
a first wafer support panel attached to a first arm of the first substantially U-shaped plate and to a first arm of the second substantially U-shaped plate; and
a second wafer support panel attached to a second arm of the first substantially U-shaped plate and to a second arm of the second substantially U-shaped plate; wherein
the first substantially U-shaped plate has a retention spring projecting outward beyond an outer lateral edge of the first substantially U-shaped plate for engaging a surface of the substrate holder when the semiconductor cassette reducer is mounted to the substrate holder.

15. The semiconductor cassette reducer of claim 14, further including a pair of column wafer supports attached to a base of the first substantially U-shaped plate and to a base of the second substantially U-shaped plate.

16. The semiconductor cassette reducer of claim 14, wherein the first substantially U-shaped plate has a pair of arms each having an interior cutout.

17. The semiconductor cassette reducer of claim 14, wherein the substrate holder is a front opening unified pod, and a base to tip distance of the first substantially U-shaped plate is less than a diameter of wafer designed for the front opening unified pod to which the semiconductor cassette reducer is adapted to be mated.

18. A semiconductor cassette reducer comprising:
a first substantially U-shaped plate;
a second substantially U-shaped plate;
a first wafer support panel attached to a first arm of the first substantially U-shaped plate and to a first arm of the second substantially U-shaped plate; and
a second wafer support panel attached to a second arm of the first substantially U-shaped plate and to a second arm of the second substantially U-shaped plate;
wherein the first substantially U-shaped plate has a plurality of flexible disks.

* * * * *